US006818285B2

United States Patent
Hedrick et al.

(10) Patent No.: US 6,818,285 B2
(45) Date of Patent: Nov. 16, 2004

(54) COMPOSITION AND METHOD TO ACHIEVE REDUCED THERMAL EXPANSION IN POLYARYLENE NETWORKS

(75) Inventors: Jeffrey C. Hedrick, Montvale, NJ (US); Muthumanickam Sankarapandian, Yorktown Heights, NY (US); Christy S. Tyberg, Mahopac, NY (US); James P. Godschalx, Midland, MI (US); Qingshan J. Niu, Midland, MI (US); Harry C. Silvis, Midland, MI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/334,413

(22) Filed: Dec. 31, 2002

(65) Prior Publication Data

US 2004/0126586 A1 Jul. 1, 2004

(51) Int. Cl.[7] .................... B32B 3/10; B32B 27/28; C08F 32/00; C08F 38/00
(52) U.S. Cl. ............ 428/209; 428/411.1; 428/901; 526/281; 526/283; 526/285
(58) Field of Search ............... 526/281, 283, 526/285; 428/411.1, 209, 901

(56) References Cited

U.S. PATENT DOCUMENTS

| 4,400,540 A | | 8/1983 | Reinhardt et al. ............ 568/31 |
| 5,093,279 A | | 3/1992 | Andreshak et al. .......... 438/662 |
| 5,262,354 A | | 11/1993 | Cote et al. .................... 216/18 |
| 5,550,405 A | | 8/1996 | Cheung et al. ............. 257/642 |
| 5,591,677 A | | 1/1997 | Jeng ............................ 438/623 |
| 5,959,157 A | * | 9/1999 | Lau et al. .................... 568/717 |
| 6,107,357 A | * | 8/2000 | Hawker et al. ............... 521/77 |

FOREIGN PATENT DOCUMENTS

| EP | 0068156 | 1/1983 |
| WO | WO 98/11149 | 3/1998 |
| WO | WO 00/40637 | 7/2000 |
| WO | WO 01/38417 A1 | 5/2001 |

OTHER PUBLICATIONS

Kumar, et al. (1995), "Diels–Adler Polymerization Between Bis(cyclopentadoenones and Acetylenes. A versatile Route to New Highly Aromatic Polymers", Macromolecules, vol. 28, pp. 124–130.

Ogliaruso, et al. (1965) Journal of Organic Chemical, vol. 30, pp. 3354–3360.

Ogliaruso, et al. (1963) Journal of Organic Chemical, vol. 28, pp. 2725–2728; and.

Hayeshi, et al., (1996) Symposium on VLSI Technology Digest of Technical Papers, pp. 88–89.

Uday Kumar, et al. (1995) "Hybrid Polymide–Polyphenylenes by the Diels–Alder Polymerization Between Biscyclopentadienones and Ethynyl–Terminated Imides", American Chemical Society, Chapter 34, pp. 518–526.

* cited by examiner

Primary Examiner—Ramsey Zacharia
(74) Attorney, Agent, or Firm—Scully, Scott, Murphy and Presser; Daniel P. Morris

(57) ABSTRACT

A crosslinked polyarylene material with a reduced coefficient of thermal expansion at high temperatures compared with conventional crosslinked polyarylene materials is provided. In addition, an integrated circuit article containing a crosslinked polyarylene polymer with reduced coefficient of thermal expansion at high temperatures is provided.

16 Claims, 1 Drawing Sheet

COMPOSITION AND METHOD TO ACHIEVE REDUCED THERMAL EXPANSION IN POLYARYLENE NETWORKS

RELATED APPLICATIONS

This application is related to U.S. application Ser. No. 10/334,438, filed Dec. 31, 2002, now abandoned, and U.S. application Ser. No 10/827,694, filed Apr. 19, 2004, which application is a continuation-in-part of the '438 application.

The U.S. Government has a paid-up license in this invention and the right in limited circumstances to require the patent owner to license others on reasonable terms as provided by the terms of Cooperative Agreement No. 70NANB8H4013 awarded by NIST (Advanced Technology Program).

This invention was made with U.S. Government support under the above-referenced Cooperative Agreement awarded by NIST. The U.S. Government thus has certain rights in this invention.

FIELD OF THE INVENTION

The present invention relates to polyarylene oligomers and polymers that display reduced thermal expansion at high temperatures. The present invention also relates to integrated circuit articles made using polyarylene dielectrics with reduced thermal expansion at high temperatures.

BACKGROUND OF THE INVENTION

The semiconductor industry's drive to continually improve performance and density has forced the use of advanced materials and interconnect structures. Interconnect performance requires the reduction of resistance and capacitance. Copper metallization was introduced in 1998 to reduce the resistance of interconnect wiring. Capacitance reduction or the introduction of low dielectric constant insulators, herein referred to as low k dielectrics, are needed for future performance enhancements.

For over 25 years, silicon dioxide has been the dielectric insulator of choice for the semiconductor industry. Silicon dioxide possesses excellent dielectric breakdown strength, a high modulus, good thermal conductivity, a low coefficient of thermal expansion, and excellent adhesion to metallic liners, plasma enhanced chemical vapor deposited (PECVD) barrier cap layers, and other like materials. However, with reduced ground rule dimensions and the need for improved performance, silicon dioxide is slowly being phased out and replaced with materials possessing lower permitivity to achieve reduced capacitance. For example, at the 180 nm technology node, fluorosilicate glass is replacing silicon dioxide in many applications.

At the 130 nm technology generation, "true" low k dielectrics are being implemented into semiconductor products. There are several candidate materials but the industry has focused on two primarily: spin-on organic polymers and carbon-doped PECVD silicon dioxide dielectrics.

Polymer dielectrics may be used as insulating layers between various circuits as well as layers within circuits in microelectronic devices, such as integrated circuits, multi-chip modules, and laminated circuit boards. The microelectronics fabrication industry is moving toward smaller geometries in its devices to enable lower power and faster speeds. As the conductor lines become finer and more closely packed, the requirements of the dielectrics between such conductors become more stringent.

While polymer dielectrics often provide lower dielectric constants than inorganic dielectrics, such as silicon dioxide, polymer dielectrics often present challenges to process integration during fabrication. For example, to replace silicon dioxide as a dielectric in integrated circuits, the polymer dielectric must be able to withstand processing temperatures during metallization and annealing steps of the process.

Preferably, the dielectric material should have a glass transition temperature greater than the processing temperature. The dielectric must also retain the desirable properties under device use conditions. For example, the dielectric should not absorb water which may cause an increase in the dielectric constant and potential corrosion of metal conductors.

WO 98/11149 discloses dielectric polymers, which are the reaction product of a cyclopentadienone functional compound and an acetylene functional compound and are useful for microelectronics fabrication.

One shortfall of polymer dielectrics, such as the polyarylene material described in WO 98/11149, is its significant increase in the coefficient of thermal expansion, herein referred to as CTE, with increasing temperature. This significant increase in the CTE of polymer dielectrics with temperature results in a large mismatch in the CTE of the dielectric and the metal interconnect lines. Interconnect fabrication processes require multiple temperature excursions from 20° C. to 400° C. (and in cases 450° C.). In the fabrication of a multilevel interconnect structures, it is common for the structure or article to be exposed to 400–450° C. for approximately 5–10 hours. The CTE mismatch between the polymer dielectric and metal lines (copper or aluminum) stresses barrier metal liner layers, potentially resulting in liner discontinuity (i.e., breaks in the liner layer). During reliability testing, the CTE mismatch manifests during thermal cycle testing where isolated via structures fail standard reliability qualifications.

In view of the state of the art, there is a need for a modified polymer dielectric that reduces the mismatch between the CTE of the polymeric dielectric and a metal such as copper or aluminum over the entire processing range.

SUMMARY OF THE INVENTION

The present invention relates to an integrated circuit article comprising a polymer dielectric that has a minimum mismatch between the coefficient of thermal expansion of the metal (e.g., copper or aluminum) and the polymer dielectric to prevent damage in the metal via structures during thermal cycling. Thus, according to a first embodiment, the present invention relates to an integrated circuit article comprising an active substrate including, at least transistors and a pattern of metal lines forming an electrical interconnect structure wherein the metal lines are at least partially separated by a polyarylene material. In the inventive integrated circuit article, the polyarylene material is a low-k dielectric that possesses a CTE of less than 110 ppm/° C. over the temperature range from 350° C. to 425° C., preferably less than 100 ppm/° C. The term "low-k' is used in the present invention to denote a dielectric material having a dielectric constant of less than 3.0, preferably less than 2.6.

The inventive integrated circuit article described in the first embodiment may include a polyarylene material which is the product of Diels Alder and phenyl acetylene cure reactions between at least one compound having two or more diene functional groups and at least one compound having two or more dienophile functional groups, wherein at least one of the compounds has three or more of said functional groups.

The integrated circuit article described in the first embodiment may include a polyarylene material which is the reaction product of at least one compound having two or more cyclopentadienone functional groups and at least one compound having two or more acetylene functional groups, wherein at least one of the compounds has three or more of said functional groups.

Preferably, the integrated article described in the first embodiment includes a polyarylene material which is the reaction product of 3,3'-(oxydi-1,4-phenylene)bis(2,4,5-triphenylcyclopentadienone) and 1,3,5-tris(phenylethynyl)benzene.

More preferably, the integrated article described in the first embodiment includes a polyarylene material which is the reaction product of 3,3'-(oxydi-1,4-phenylene)bis(2,4,5-triphenylcyclopentadienone) and 1,3,5-tris(phenylethynyl)benzene wherein the stoichiometric molar ratio of the two monomers is between 0.7/1 and 0.99/1, respectively.

The second embodiment of the present invention is a cured polyarylene material which is the product of Diels Alder and phenyl acetylene cure reactions between at least one compound having two or more diene functional groups and at least one compound having two or more dienophile functional groups, wherein at least one of the compounds has three or more of said functional groups; said polyarylene material having a coefficient of thermal expansion as determined by thermal mechanical analysis of less than 110 ppm/° C. over a temperature range of 350°–425° C.

Preferably, the polyarylene material described in the second embodiment is one wherein the diene functional groups are cyclopentadienone groups and the dienophile functional groups are acetylene groups.

The polyarylene material described in the second embodiment may include at least one compound having dienophile functional groups which comprises a first compound that has two dienophile groups and a second compound having more than two dieneophile groups.

The polyarylene material described in the second embodiment may be a material wherein the second compound has three dienophile groups.

A third embodiment of the current invention is a cured polyarylene material comprising the reaction product of 3,3'-(oxydi-1,4-phenylene)bis(2,4,5-triphenylcyclopentadienone) and 1,3,5-tris(phenylethynyl)benzene wherein the stoichiometric molar ratio of the two monomers is between 0.7/1 and 0.99/1, respectively, wherein said polyarylene polymer has been cured at a temperature of at least 405° C. for at least one hour, wherein said polyarylene material possesses a coefficient of thermal expansion as determined by thermal mechanical analysis of less than 110 ppm/° C. over a temperature range of 350°–425° C.

In the third embodiment, the polyarylene material is a material wherein the most preferable monomer ratio is 0.9/1.

More specifically, the polyarylene material described in the third embodiment is a material wherein the preferred cure profile is 410° C. for 90 minutes or 415° C. for 60 minutes.

A fourth embodiment of the present invention relates to an integrated circuit article comprising an active substrate containing transistors, an electrical interconnect structure comprising a pattern of metal lines, and one of the polyarylene material described in the third embodiment at least partially separating the lines.

BRIEF DESCRIPTION OF THE DRAWINGS

The sole FIGURE is a plot of the coefficient of thermal expansion (CTE) versus temperature for a series of polyarylene material dielectric samples as a function of chemical composition (i.e., molar stoichiometry) and cure conditions.

DETAILED DESCRIPTION OF THE INVENTION

Figure 1:
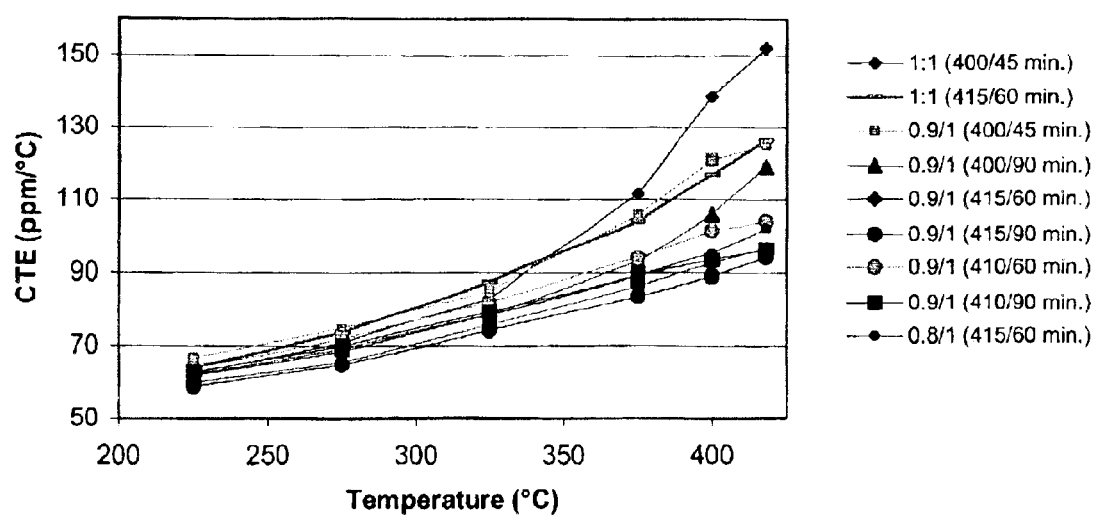

The present applicants have unexpectedly discovered that an integrated circuit article requires a polymer dielectric that has a minimum mismatch between the coefficient of thermal expansion of the metal and the polymer dielectric to prevent damage in the metal during thermal cycling. Thus, according to a first embodiment, the present invention relates to an integrated circuit article comprising an active substrate including at least transistors and a pattern of metal lines forming an electrical interconnect structure wherein the metal lines are at least partially separated by an organic polymeric material, preferably a polyarylene material. It should be noted that the terms "polyarylene" and "polyphenylene" are equivalently used throughout the present application. In this inventive integrated circuit article, the polyarylene material dielectric possesses a CTE of less than 110 ppm/° C. over the temperature range from 200° C. to 425° C., preferably less than 100 ppm/° C.

The term "polyarylene" is used herein to denote a material which predominately comprises aromatic rings directly bonded to other aromatic rings. These aromatic rings may be phenyl rings; substituted phenyl rings; fused aromatic systems such as naphthalene, anthracene, phenanthrene, fluorene, and substituted fused aromatic rings. There may be linking groups in the polyarylene polymer chain, such as oxygen, sulfur, sulfones, sulfoxides, amines, phosphorous, silicon, aliphatic carbon groups, carbonyl, carboxylate, and the like, separating some of these, aromatic rings. Substituent groups on the aromatic rings may be essentially inert or may be reactive species which can further react and/or link two or more polyarylene polymer chains together.

Preferred polyarylenes are the reaction product of a compound having two or more diene functional reactive groups and a compound having two or more dienophile functional reactive groups. The preferred polyarylenes are cross-linked materials; therefore, at least some of the compounds must have three or more reactive groups. The preferred polyarylenes (including precursor b-staged, curable oligomers) typically have the formula:

wherein A has the structure:

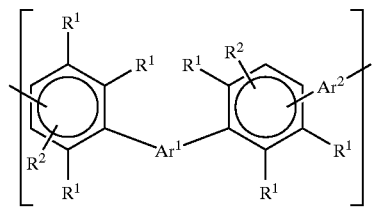

and B has the structure:

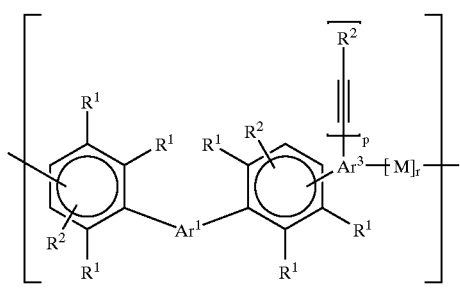

wherein EG are end groups having one or more of the structures:

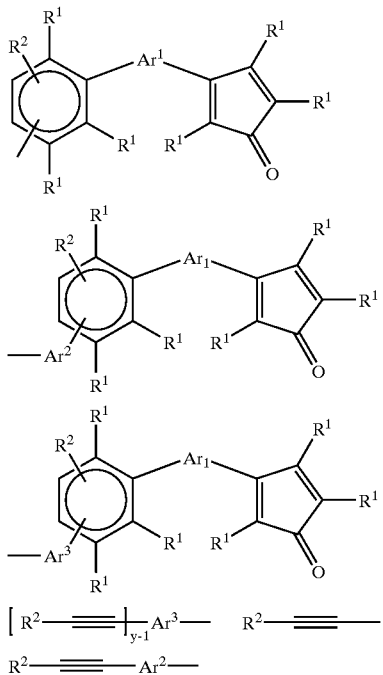

wherein $R^1$ and $R^2$ are, independently, H or an unsubstituted or inertly-substituted aromatic moiety; $Ar^1$, $Ar^2$ and $Ar^3$ are, independently, an unsubstituted aromatic moiety or inertly-substituted aromatic moiety; M is a bond; y is an integer of three or more; p is the number of unreacted acetylene groups in the given mer unit; r is one less than the number of reacted acetylene groups in the given mer unit; p+r=y−1; z is an integer from 1 to 1000; w is an integer from 0 to 1000; and v is an integer of 2 or more.

Such oligomers and polymers can be prepared by reacting a biscyclopentadienone and an aromatic acetylene containing three or more acetylene moieties.

Such a reaction may be represented by the reaction of compounds of the formulas:

(a) a biscyclopentadienone of the formula:

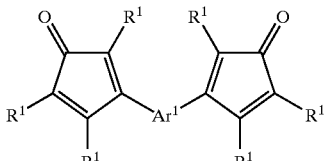

(b) a polyfunctional acetylene of the formula:

where $R^1$, $R^2$, $Ar^1$, $Ar^3$ and y are as previously defined.

The definition of aromatic moiety includes phenyl, polyaromatic and fused aromatic moieties. Inertly-substituted means the substituent groups are essentially inert to the cyclopentadienone and acetylene polymerization reactions and do not readily react under the conditions of use of the cured polymer in microelectronic devices with environmental species, such as water. Such substituent groups include, for example, F, Cl, Br, —$CF_3$, —$OCH_3$, —$OCF_3$, —O-Ph, an alkyl containing from 1 to 8 carbon atoms, and a cycloalkyl containing from 3 to 8 carbon atoms. For example, the moieties which can be unsubstituted or inertly-substituted aromatic moieties include:

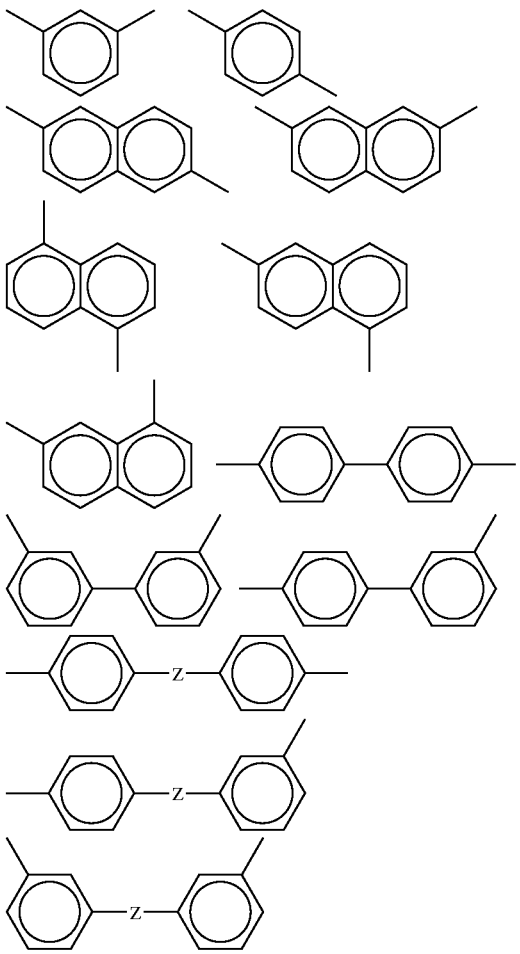

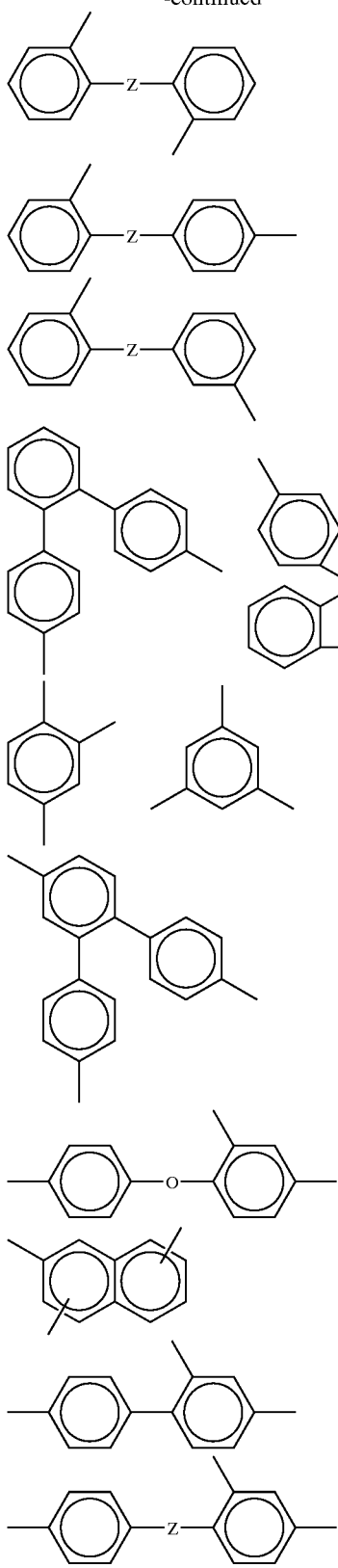

wherein Z can be: —O—, —S—, alkylene, —CF$_3$—, —CH$_2$—, —O—CF$_2$—, perfluoroalkyl, perfluoroakoxy,

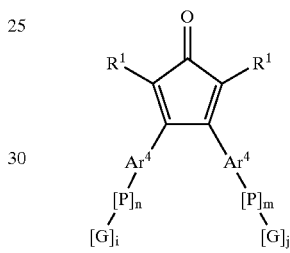

wherein each R$^3$ is independently —H, —CH$_3$, —CH$_2$CH$_3$, —(CH$_2$)$_2$CH$_3$ or Ph, e.g., phenyl.

Another group of preferred polyarylene oligomers and polymers may be represented by the formula:

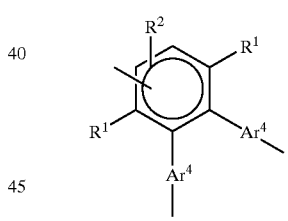

wherein P represents the growing branching oligomer/polymer chain and has the repeating structure:

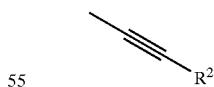

and wherein G groups are the end-groups filling the valencies where oligomer/polymer growth has not occurred and have the structure:

wherein R$^1$ and R$^2$ are, independently, H or unsubstituted or inertly substituted aromatic moieties; Ar$^4$ is an aromatic moiety or an inertly substituted aromatic moiety; i and j are integers greater than or equal to 1, with the proviso that i+j is greater than or equal to 3; and n and m are integers greater than or equal to 0, with the proviso that n+m is greater than or equal to 1. Such a polymer may be prepared by the reaction of the cyclopentadienone functionality and the acetylene functionality of a polyfunctional compound of the general formula:

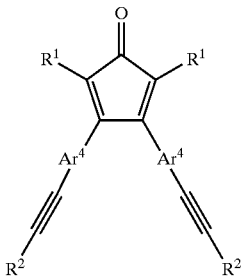

wherein $R^1$, $R^2$, and $Ar^4$ are as defined previously.

A polyfunctional compound containing two or more aromatic cyclopentadienone moieties may be made by the condensation of benzils with benzyl ketones using conventional methods. Exemplary methods are disclosed, for example, in Kumar, et al. *Macromolecules*, 1995, 28, 124–130; Ogliaruso, et al., *J. Org. Chem.*, 1965, 30, 3354; Ogliaruso, et al., *J. Org. Chem.*, 1963, 28, 2725; and U.S. Pat. No. 4,400,540. The contents of each of the foregoing disclosures are incorporated herein by reference.

A polyfunctional compound containing two or more aromatic acetylene moieties may be made by conventional methods. An aromatic compound may be halogenated and then reacted with the appropriate substituted acetylene in the presence of an aryl ethynylation catalyst to replace the halogen with the substituted acetylene compound. The polymerization steps may be carried out by using the process disclosed, for example, in WO 98/11149, the content of which is incorporated herein by reference.

The polyarylenes may be applied to the integrated circuit device according to any known process, such as, for example, solution deposition, liquid-phase epitaxy, screen printing, melt-spinning, dip coating, roll coating, spinning, brushing (for example, as a varnish), spray coating, powder coating, plasma-deposition, dispersion-spraying, solution-casting, slurry-spraying, dry-powder-spraying, fluidized bed techniques, welding, explosion methods including the Wire Explosion Spraying Method and explosion bonding, press bonding with heat, plasma polymerization, dispersion in a dispersion media with subsequent removal of dispersion media, pressure bonding, heat bonding with pressure, gaseous environment vulcanization, extruding molten polymer, hot-gas welding, baking, coating and sintering. Mono- and multilayer films can also be deposited onto a substrate using a Langmuir-Blodgett technique at an air-water or other interface. Preferably, the curable polyarylene oligomer solution is spin coated onto the substrate from an organic solvent.

Suitable organic solvents include, but are not limited to: mesitylene, pyridine, triethylamine, N-methylpyrrolidinone (NMP), methyl benzoate, ethyl benzoate, butyl benzoate, cyclopentanone, cyclohexanone, cycloheptanone, cyclooctanone, cyclohexylpyrrolidinone, and others or hydroxy ethers, such as dibenzylethers, diglyme, triglyme, diethylene glycol ethyl ether, diethylene glycol methyl ether, dipropylene glycol methyl ether, dipropylene glycol dimethyl ether, toluene, xylene, benzene, dipropylene glycol monomethyl ether acetate, dichlorobenzene, propylene carbonate, naphthalene, diphenyl ether, butyrolactone, dimethylacetamide, dimethylformamide and mixtures thereof.

The preferred solvents that may be employed in the present invention are mesitylene, N-methylpyrrolidinone (NMP), gamma-butyrolactone, diphenylether, cyclohexanone, and mixtures thereof.

After coating, the oligomer or polymer is preferably exposed to temperatures sufficient to advance the oligomer or polymer to a higher molecular weight, and in the most preferred examples, to a cross-linked polymer with the desired coefficient of thermal expansion.

The integrated circuit article of the present invention may be made according to any known method in the art, such as those fabricated with silicon or gallium arsenide. An integrated circuit would, typically, have multiple layers of metal conductors separated by one or more insulating materials. The polyarylene can be used as insulation between discrete metal conductors in the same layer, and/or between conductor levels of the interconnect structure. The polyarylene can also be used in combination with other materials such as other spin on organics, inorganics, or organic-inorganic hybrids, other CVD materials with the composition of SiCOH, fluorinated spin-on glass (FSG), $SiO_2$, or $Si_3N_4$, in a composite interconnect structure. For example, integrated circuit devices may be made as is disclosed in U.S. Pat. No. 5,550,405; U.S. Pat. No. 5,591,677; Hayeshi, et al., 1996 *Symposium on VLSI Technology Digest of Technical Papers*, pg. 88–89; and WO 98/11149.

The inventive integrated circuit articles can be made by any known process such as either a "damascene" metal inlay or subtractive metal patterning scheme. Processes for fabricating damascene lines and vias are known in the art. See, for example, U.S. Pat. Nos. 5,262,354 and 5,093,279.

Patterning of the material may be done with typical reactive ion etch (RIE) procedures using oxygen, argon, nitrogen, helium, carbon dioxide, fluorine-containing compounds, or mixture of these and other gases, using a photoresist "softmask", such as, for example, an epoxy novolac, or a photoresist in combination with an inorganic "hardmask" such as, for example, $SiO_2$, $SiO_3N_4$, or a metal.

The polyarylene may be used in conjunction with aluminum (Al), Al alloys, copper (Cu), Cu alloys, gold (Au), silver (Ag), tungsten (W) and other common metal conductor materials (for conductive lines and plugs) deposited by physical vapor deposition, chemical vapor deposition, evaporation, electroplating, electroless deposition, and other deposition methods. Additional metal layers to the basic metal conductors, such as tantalum, titanium, tungsten, chromium, cobalt, their alloys, or their nitrides, may be used to fill holes, enhance metal fill, enhance adhesion, provide a barrier, or modify metal reflectivity.

Depending on fabrication architecture, either metal or the dielectric material of the present invention may be removed or planarized using chemical-mechanical polishing techniques.

The applicants have unexpectedly discovered that, for integrated circuit articles, a maximum coefficient of thermal expansion of the polyarylene dielectric of less than 110 ppm/° C. over the temperature range from 200° C. to 425° C., preferably less than 100 ppm/° C., as measured by thermal mechanical analysis of thick films in tension under inert conditions, is needed in order for the articles to withstand thermal cycling during the build and subsequent thermal cycle reliability testing without generating defects or failures in the metal via structures.

It was discovered that a unique combination of a specific polyarylene composition and cure conditions (i.e., heat treatment) yields a significantly reduced coefficient of thermal expansion for the polyarylene material dielectric. To achieve the polyarylene compositions, a bifunctional diene compound (preferably a biscyclopentadienone) and a tri- or higher functional dienophile (preferably a trisacetylene) are reacted. The molar ratios of the monomers are modified leading to variations in crosslink density of the resultant cured resin. The crosslink density of the resultant cured resin increased and the coefficient of thermal expansion at high temperatures decreased.

In addition, cure conditions, such as temperature and time of cure have an effect on the crosslink density and therefore affect the coefficient of thermal expansion at high temperatures (>300° C.). For instance, if the cure temperature is not sufficient to allow the crosslinking reactions to go to completion, the crosslink density of the network is lower and therefore the coefficient of thermal expansion at high temperatures is higher. As a result, the coefficient of thermal expansion can be minimized by controlling the cure temperature and time. That is, higher cure temperatures and longer cure times can lead to a lower coefficient of thermal expansion at temperatures>300° C. In order to achieve the lowest CTE high temperatures, the cure temperature is preferably no less than 405° C., more preferably from about 405° to about 415° C. for a time period of from about 60 to about 100 minutes, and even more preferably at a temperature from about 410° to about 420° C. for a time period of from about 40 to about 70 minutes. As an example, certain samples of the low CTE formulation cured at 400° C. for 45 minutes have a CTE of 120+/−5 at 400° C., whereas, samples of the same formulation cured at 410° C. for 90 minutes have a CTE of 93+/−5 at 400° C.

The following examples are set forth to illustrate the present invention and should not be constructed to limit its scope. In the examples, all parts and percentages are by weight unless otherwise indicated.

EXAMPLE 1

Preparation of Cyclopentadienone Compounds and Acetylene Compounds 1,3,5-Tris(phenylethyl) benzene (Compound A)

Triethylamine (375 g), triphenylphosphine (4.7865 g), palladium acetate (1.0205 g), and N,N-dimethyl formamide (2000 mL) were charged to a 5 liter 3-necked round bottom flask equipped with a thermocouple, an overhead mechanical stirrer, a condenser, an addition funnel, and a heating mantle with a temperature controller. This mixture was stirred for 5 minutes to dissolve the catalyst. Then, diethylhydroxylamine (5 g), 1,3,5-tribromobenzene (190 g) and phenylacetylene (67.67 g) were added. The reactor was purged with nitrogen for 15 minutes, and then heated to 70° C. while maintaining a nitrogen atmosphere. After heating at 70° C. for 30 minutes, phenylacetylene (135.33 g) was slowly added dropwise over a period of 1 hour, and the temperature increased to 80° C. Heating was continued an additional 9 hours. The reaction was then cooled to room temperature and water (1 liter) was added which precipitates crude product. The product was filtered, washed three times with 500 mL portions of water, then once with 500 mL of cyclohexane. The crystals were vacuum dried at 75° C. overnight to give 226.40 g (99.1 percent yield) that was 97.25 area percent pure by gas chromatography. The crystals were dissolved in toluene (1800 mL), refiltered through silica gel, and the solvent removed on a rotary evaporator to give 214.2 g (94.2 percent yield) that was 99.19 area percent pure by gas chromatography. The residue was then recrystallized from a mixture of toluene (375 mL) and 2-propanol (696 mL). The white crystals were filtered, rinsed with a mixture of toluene (100 mL) and 2-propanol (400 mL), and vacuum dried at 75° C. overnight to give 1,3,5-tris (phenylethynyl)benzene (190.0 g, 83.91 percent yield) that was 99.83 area percent pure by gas chromatography. Additional recrystallizations from toluene/isopropanol gives material of acceptable organic and ionic purity.

3.3'-(Oxydi-1,4-phenylene)bis(2,4,5-triphenylcyclopentadieone) (Compound C)

(a) Preparation of 4.4'-diphenylaceyldiphenyl ether

To a slurry of aluminum chloride (97.9 g, 0.734 mol) in methylene dichloride (200 mL) at 0° C. was added, dropwise, a solution of diphenyl ether (50.0 g, 0.294 mol) and phenylacetyl chloride (102 g, 0.661 mol) in methylene chloride (50 mL), over a 30 minute period. When the addition was completed, the reaction mixture was allowed to warm to ambient temperature and stirred overnight. The reaction mixture was carefully poured, with stirring, into 1.5 kg of ice/water. Methylene chloride (1500 mL) was added to dissolve the solids and the layers were separated. The organic layer was filtered through celite, then concentrated to dryness. Recrystallization from toluene gave 110 g (92 percent) of the title compound as light tan prisms.

(b) Preparation of 4.4'-Bis(phenylglyoxaloyl)diphenyl Ether

Aqueous HBr (97 mL of a 48 weight percent solution) was added to a slurry of 4.4'-diphenylacetyldiphenyl ether (50.0 g, 0.123 mol) in DMSO (400 mL) and the resulting mixture was heated to 100° C. for two hours, then cooled to ambient temperature. The reaction mixture was partitioned between toluene (500 mL) and water (750 mL). The organic layer was washed with water (3×250 mL), followed by washing with brine, and concentration to give a viscous, bright yellow oil which solidified upon standing at ambient temperature. Recrystallization from ethanol gave 35.9 g (67 percent) of the title compound as bright yellow cubes.

(c) Preparation of Compound C

To a nitrogen purged 5-L Morton flask equipped with a thermocouple, reflux condenser with nitrogen inlet, mechanical stirrer, and addition funnel was added, 195.4 g (0.4498 mol, 1.0 eq) 4.4'-bis(phenylglyoxaloyl)diphenyl ether, 193.9 g diphenylacetone (0.9220 mol, 2.05 eq), and 2.5 liter deoxygenated ethanol. The mixture was heated to reflux, at which point a homogeneous solution was attained, and the solution was sparged with nitrogen for 30 minutes. To the addition funnel was added a solution containing 25.2 g KOH (0.4498 mol, 1.0 eq), 200 mL ethanol, and 25 mL water. The temperature was reduced to 74° C. and the KOH solution was added rapidly over 5 minutes. An exothermic reaction was quickly established and maintained reflux until ¾ of the solution was added, whereafter the temperature begins to decrease. A dark purple color was observed immediately upon addition of base and solid was observed before addition was complete. After complete addition, the heterogeneous solution was heated at a strong reflux for 15 minutes and much solid product was formed. The mixture was allowed to cool to 25° C. and 29.7 g glacial acetic acid (0.4984 mol, 1.1 eq.) was added and stirred for 30 minutes. The crude product was isolated by filtration and washed in the filter funnel with filter water, 3 liter EtOH, 2 liter MeOH, and dried for 12 hours at 60° C. to 90° C. under vacuum giving 323 g (92 percent) crude DPO-CPD, which was 94 percent pure by LC. The cured material was dissolved in HPLC grade methylene chloride (10 weight percent), transferred to a 5 liter Morton flask equipped with a bottom flush valve and mechanical strirrer, and washed vigorously for 10 to 90 minutes, 2 to 7 times with equal volume portions of low ionic water. The $CH_2Cl_2$ solution was then flashed through a 5 cm column containing 75 g of silica gel in $CH_2Cl_2$. The column was washed with an additional 1 liter $CH_2Cl_2$ at which point the filtrate was essentially clear. The solution was evaporated to dryness and re-dissolved in THF and evaporated again to remove the bulk of the residual methylene chloride. The powder was transferred to a 5 liter flask equipped with addition funnel and Friedrichs reflux condenser, and dissolved (0.07 to 0.12 grams per mL) in deoxygenated HPLC THF at reflux. An additional 1 liter THF was then added and a nitrogen sparge tube was inserted into the solution. The solution was sparged with nitrogen for three hours and the THF was condensed at 45° C. to 50° C. while residual methylene chloride was removed by distillation. A distillation head was attached and 700 mL to 1 liter THF was removed. The solution was then allowed to slowly cool over several hours to room temperature, then cooled with an ice bath to below 10° C. during which time crystallization occurs. The crystals were isolated using a 5 mm PTFE filter in a 4 liter Millipore clamp-frit suction filtration flask. The crystals were then washed with 1 liter MeOH and dried over night at 80° C. to 90° C. under vacuum giving 70 to 85 percent yield DPO-CPD with 99 percent LC purity, mp 270° C.

EXAMPLE 2

Preparation of a Series of Oligomer Solutions from 3,3'-(oxydi-1,4-phenylene)bis(2,4,5-triphenylcyclopentadienone) (Compound C) and 1,3,5-Tris(phenylethynyl)benzene (Compound A) and property measurements A series of Oligomer Solutions from 3,3'-(oxydi-1,4-phenylene)bis(2,4,5-triphenylcyclopentadienone) (Compound C) and 1,3,5-Tris(phenylethynyl)benzene (Compound A), wherein the molar ratio of the components was varied, such that the moles of Compound C are equal to or less than the moles of Compound A, specifically the molar ratios used to prepare the oligomer solutions varied from 1:1 (C:A) to 0.8:1(C:A). The monomers were reacted in gamma-butyrolactone at 30 percent solids by heating to 200° C. for a period of 24–48 hours. The solutions were cooled to approximately 130° C. then diluted to 20 percent solids with cyclohexanone. The solutions were then allowed to cool to room temperature.

The coefficient of thermal expansion of the cured films was measured using a thermal mechanical analyzer with a quartz assembly in tension mode. Films of 9–17 microns were prepared by coating multiple layers of the oligomer solution onto a wafer followed by a 400° C.—5 minute hot plate bake (under a Nitrogen purge) of each layer prior to depositing the next layer. After the desired thickness was achieved the films were cured (on wafer) in an oven under Forming gas for the specified cure time and temperature. After curing, the samples were placed in dilute 100:1 water:HF to promote delamination of the film from the wafer. The films were then rinsed with deionized water and dried in a vacuum oven at ~80° C. for ~1 hour.

The films were then cut into strips of ~2 mm×15 mm and loaded into the thermal mechanical analyzer quartz tension assembly. The films were heated from ~50° C. to 430° C. at 5° C./minute and the expansion was measured.

An example of the relationship between monomer ratio and cure conditions on the CTE at 400° C. is illustrated in Table 1.

TABLE 1

| Sample | Molar ratio of compound C:A | Cure Temperature (° C.) | Cure Time (min.) | CTE at 400° C. (ppm/° C.) |
| --- | --- | --- | --- | --- |
| A | 1:1 | 400 | 45 | 139 +/− 6 |
| B | 1:1 | 415 | 60 | 117 +/− 5 |
| C | 0.9:1 | 400 | 45 | 121 +/− 4 |
| D | 0.9:1 | 400 | 90 | 106 +/− 4 |
| E | 0.9:1 | 410 | 60 | 101 +/− 2 |
| F | 0.9:1 | 410 | 90 | 93 +/− 1 |
| G | 0.9:1 | 415 | 60 | 94 +/− 3 |
| H | 0.9:1 | 415 | 90 | 89 +/− 4 |
| I | 0.8:1 | 415 | 60 | 95 +/− 4 |

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims.

What is claimed is:

1. An integrated circuit article comprising an active substrate including at least transistors, an electrical interconnect structure comprising a pattern of metal lines, and a polyarylene material having a coefficient of thermal expansion, as determined by thermal mechanical analysis, of less than 110 ppm/° C. over a temperature range of 200° C.–425° C.

2. The article of claim 1 wherein the polyarylene material is a product of Diels Alder and phenyl acetylene cure reactions between at least one compound having two or more diene functional groups and at least one compound having two or more dienophile functional groups, wherein at least one of the compounds has three or more of said functional groups.

3. The article of claim 1 wherein the polyarylene material is a reaction product of at least one compound having two or more cyclopentadienone functional groups and at least one compound having two or more acetylene functional groups, wherein at least one of the compounds has three or more of said functional groups.

4. The article of claim 1 wherein the polyarylene material is a reaction product of 3,3'-(oxydi-1,4-phenylene)bis(2,4,5-triphenylcyclopentadienone) and 1,3,5-tris (phenylethynyl)benzene.

5. The article of claim 1 wherein the polyarylene material is a reaction product of 3,3'-(oxydi-1,4-phenylene)bis(2,4,5-triphenylcyclopentadienone) and 1,3,5-tris (phenylethynyl)benzene wherein the stoichiometric molar ratio of the two monomers is between 0.7/1 and 0.99/1, respectively.

6. A cured polyarylene which is a product of Diels Alder and phenyl acetylene cure reactions between at least one compound having two or more diene functional groups and at least one compound having two or more dienophile functional groups, wherein at least one of the compounds has three or more of said functional groups and having a coefficient of thermal expansion, as determined by thermal mechanical analysis, of less than 110 ppm/° C. over a temperature range of 200° C.–425° C.

7. The cured polyarylene of claim 6 wherein the diene functional groups are cyclopentadienone groups and the dienophile functional groups are acetylene groups.

8. The cured polyarylene of claim 6 in which at least one compound having dienophile functional groups comprises a first compound which has two dienophile groups and a second compound having more than two dieneophile groups.

9. The cured polyarylene of claim 8 wherein the diene functional groups are cyclopentadienone groups and the dienophile groups are acetylene groups.

10. The cured polyarylene of claim 8 wherein the second compound has three dienophile groups.

11. An integrated circuit article comprising an active substrate including at least transistors, an electrical interconnect structure comprising a pattern of metal lines, and the cured polyarylene of claim 6 at least partially separating the metal lines.

12. A cured polyarylene which is the reaction product of 3,3'-(oxydi-1,4-phenylene)bis(2,4,5-triphenylcyclopentadienone) and 1,3,5-tris(phenylethynyl)benzene with a stoichiometric molar ratio of the two monomers between 0.70/1 and 0.99/1, respectively; which has been cured at a temperature of at least 405° C. for at least one hour; which has a coefficient of thermal expansion, as determined by thermal mechanical analysis, of less than 110 ppm/° C. over a temperature range of 200° C.–425° C.

13. The cured polyarylene of claim 12 wherein the most preferable stoichiometric molar ratio is 0.9/1 (3,3'-(oxydi-1,4-phenylene)bis(2,4,5-triphenylcyclopentadienone) and 1,3,5-tris(phenylethynyl)benzene, respectively.

14. The cured polyarylene of claim 12 wherein the cure is at a temperature from about 405° to about 410° C. for a time period of about 60 to about 100 min.

15. The cured polyarylene of claim 12 wherein the cure is at a temperature from about 410° to about 425° C. for a time period of about 40 to about 75 minutes.

16. An integrated circuit article comprising an active substrate including at least transistors, an electrical interconnect structure comprising a pattern of metal lines, and the cured polyarylene of claim 12 at least partially separating the metal lines.

* * * * *

UNITED STATES PATENT AND TRADEMARK OFFICE
CERTIFICATE OF CORRECTION

PATENT NO. : 6,818,285 B2 Page 1 of 1
APPLICATION NO. : 10/334413
DATED : November 16, 2004
INVENTOR(S) : Hedrick et al.

It is certified that error appears in the above-identified patent and that said Letters Patent is hereby corrected as shown below:

Title Page,
Item (73) Assignee, should read:

INTERNATIONAL BUSINESS MACHINES CORPORATION, Armonk, NY 10504 (US) and DOW GLOBAL TECHNOLOGIES, INC., 1790 Building, Washington Street, Midland, Michigan 48674 (US)

Signed and Sealed this

Twenty-second Day of May, 2007

JON W. DUDAS
*Director of the United States Patent and Trademark Office*